(12) United States Patent
Kim et al.

(10) Patent No.: US 10,536,119 B2
(45) Date of Patent: Jan. 14, 2020

(54) AMPLIFIER WITH SECOND-HARMONIC TRAP

(71) Applicant: Avago Technologies International Sales Pte. Limited, Singapore (SG)

(72) Inventors: Min-Su Kim, Seoul (KR); Namsoo Kim, Seoul (KR); Eun-gyu Hong, Incheon (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/907,540

(22) Filed: Feb. 28, 2018

(65) Prior Publication Data

US 2019/0267951 A1 Aug. 29, 2019

(51) Int. Cl.
| | |
|---|---|
| *H03F 3/191* | (2006.01) |
| *H03F 1/32* | (2006.01) |
| *H03F 3/195* | (2006.01) |
| *H04B 1/40* | (2015.01) |

(52) U.S. Cl.
CPC .......... *H03F 1/3205* (2013.01); *H03F 3/195* (2013.01); *H03F 2200/181* (2013.01); *H03F 2200/267* (2013.01); *H03F 2200/294* (2013.01); *H03F 2200/378* (2013.01); *H03F 2200/451* (2013.01); *H03F 2200/541* (2013.01); *H04B 1/40* (2013.01)

(58) Field of Classification Search
CPC . H03F 1/22; H03F 1/223; H03F 3/191; H03F 3/193

USPC .......................................... 330/283, 305, 311
See application file for complete search history.

(56) References Cited

U.S. PATENT DOCUMENTS

| | | | |
|---|---|---|---|
| 5,339,048 A * | 8/1994 | Weber | ................... H03F 1/3205 330/302 |
| 6,681,103 B1 | 1/2004 | Rogers et al. | |
| 9,407,379 B2 | 8/2016 | Lau et al. | |
| 9,548,155 B2 | 1/2017 | Andersson et al. | |
| 9,712,195 B2 | 7/2017 | Wang et al. | |

\* cited by examiner

*Primary Examiner* — Steven J Mottola
(74) *Attorney, Agent, or Firm* — Sheridan Ross P.C.

(57) ABSTRACT

An amplifier circuit for amplifying an input signal includes a transistor configured to receive the input voltage via an input port, and a second-harmonic trap connected between the transistor and ground, the second-harmonic trap having an impedance high enough to enable the second-harmonic trap to act as an open circuit at a second harmonic frequency of a voltage provided by the transistor. The second-harmonic trap includes a transformer including a primary winding connected to ground and a secondary winding, the primary winding receiving the voltage provided by the transistor. The second-harmonic trap further includes a variable capacitor connected in parallel with the secondary winding of the transformer, the variable capacitor having an adjustable capacitance that may be adjusted for the second-harmonic trap to act as the open circuit at the second harmonic frequency.

19 Claims, 3 Drawing Sheets

AMPLIFIER WITH SECOND-HARMONIC TRAP

BACKGROUND

Wireless communication systems may include a transceiver having at least one receiver and at least one transmitter connected to a common antenna through corresponding filters. The filters are often band pass filters, respectively included in the receive chain and the transmit chain of the transceiver, which filter out signal frequencies outside the corresponding receive passbands and transmit passbands. Signals with frequencies within a particular passband may be referred to as being in-band, while signals with frequencies outside the particular passband may be referred to as out-of-band (some of which may be in-band in other passbands). Modern wireless communication systems typically support multi-band, multi-standard and multi-mode receivers. Such systems also require low noise performance and high linearity for high data rates, and therefore include low noise amplifiers (LNAs). High linearity and low noise performance of an LNA is important, since the LNA is often the first component in a receiver chain, and therefore heavily influences performance of the other components in the receiver chain.

One useful type of LNA is a cascode LNA, which is a multiple stage amplifier including at least two transistors. The transistors may be any of various types of transistors, including field effect transistors (FETs) or bipolar junction transistors (BJTs), for example. For ease of explanation, the descriptions throughout will assume use of FETs, although it is understood that the BJTs or other types of compatible transistors may be substituted for the FETs without changing general operation of the circuit, as would be apparent to one of ordinary skill in the art. A cascode LNA may be implemented using a common source transistor connected at its drain to the source of a common gate transistor, for example.

Cascode LNAs with inductive source degeneration are widely used to improve noise performance for narrow-band applications. A conventional cascode LNA with inductive source degeneration includes a degeneration inductor connected between ground and the source of a first transistor (configured to receive an input voltage at its gate). However, in multi-band, multi-standard and/or multi-band receivers, out-of-band signals may be present, which may be interfering signals (e.g., "interferers" or "jammers"). The intermodulation and harmonics of such interfering signals can fall in-band of a particular passband, causing interference with the desired or wanted in-band signal.

Suppression of such in-band interference caused by the intermodulation and harmonics of interfering signals should be addressed in the LNA, since the interference may otherwise degrade receiver sensitivity and overall receiver performance further down the receiver chain. Due to the high linearity requirement, recent LNAs need to have additional linearization circuits, which consume more power and increase complexity, which are undesirable.

Accordingly, there is a need for providing an LNA capable of efficiently suppressing the second harmonic frequency, with little to no increase in power consumption and system complexity.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments. Further, it is understood that the various configurations of electrical components and connections depicted in the figures are illustrative, and therefore may vary without departing from the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, various embodiments include an amplifier circuit, such as a low noise amplifier (LNA) circuit, for amplifying an input signal. The amplifier circuit includes a first transistor configured to receive the input voltage via an input port, and a second-harmonic trap connected between the first transistor and ground, the second-harmonic trap having an impedance high enough to enable the second-harmonic trap to act as an electrically open circuit at a second harmonic frequency of a voltage provided by the first transistor. The second-harmonic trap includes a transformer including a primary winding having a primary inductance and a secondary winding having a secondary inductance, the primary winding receiving the voltage provided by the transistor and is connected to ground. The second-harmonic trap further includes a variable capacitor connected in parallel with the secondary winding of the transformer, the variable capacitor having an adjustable capacitance. The adjustable capacitance may be adjusted for the second-harmonic trap to act as the open circuit at the second harmonic frequency. For example, the variable capacitor and the secondary winding form an LC resonance circuit, and the variable capacitor is adjustable such that LC resonant frequency of the LC resonance circuit substantially equals a reciprocal of the second harmonic frequency, resulting in the high second-harmonic trap impedance. The amplifier circuit may also include a second transistor cascoded with the first transistor. The second transistor is configured to output an output voltage via an output port to provide an amplified output signal.

Figure 1:
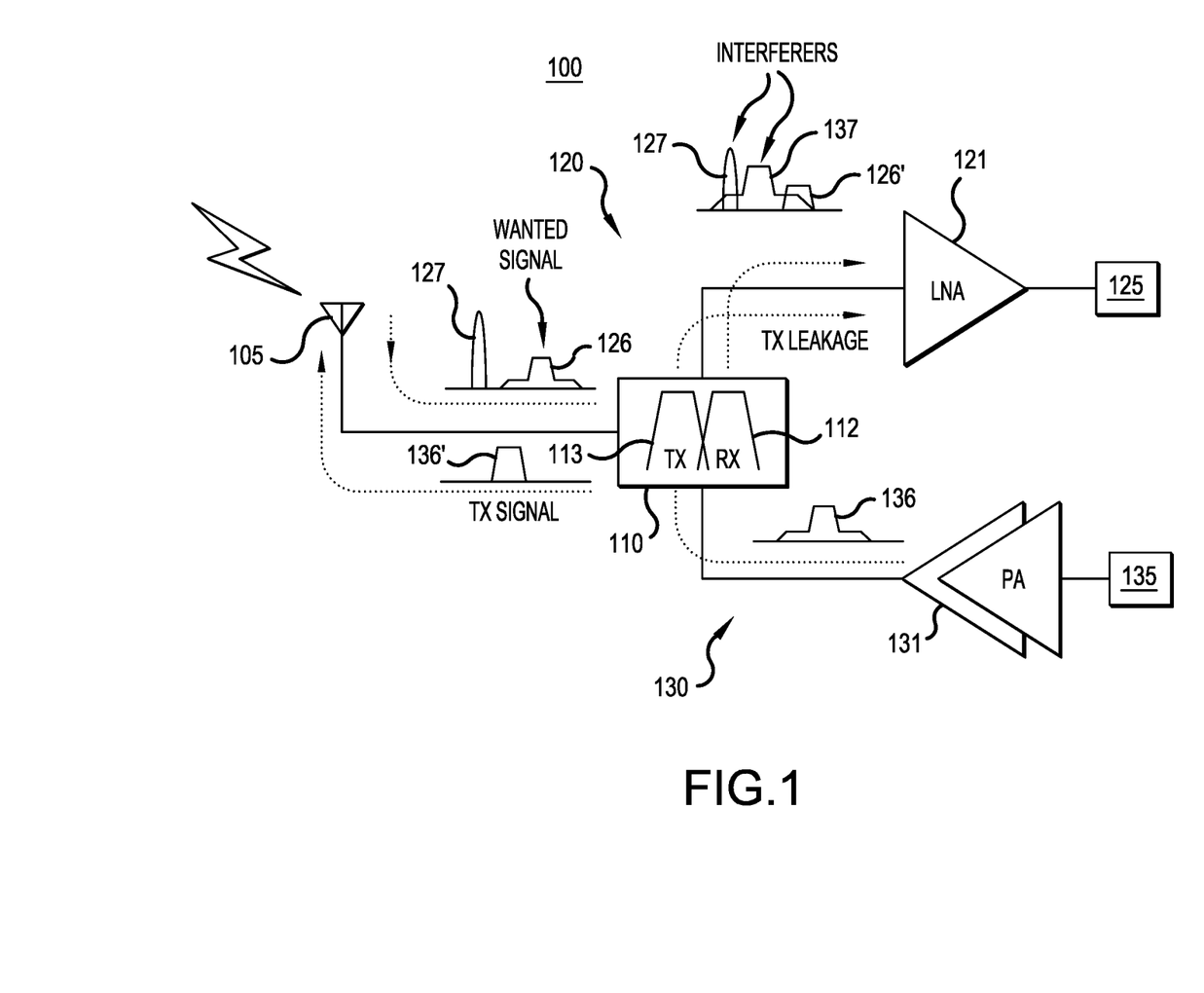
FIG. 1 is a simplified block diagram of a multi-mode transceiver for receiving and transmitting RF signals in multiple bands in accordance with multiple standards.

FIG. 1 is a simplified block diagram of a multi-mode transceiver for receiving and transmitting RF signals in multiple bands in accordance with multiple standards.

Referring to FIG. 1, transceiver 100 includes an antenna 105, a band pass filter circuit 110, a receiver chain 120 and a transmitter chain 130. The band pass filter circuit 110 includes a receive passband 112 for filtering incoming radio frequency (RF) receive signal 126 (in a predetermined frequency band) received by the antenna 105 to provide filtered RF receive signal 126'. The filtered RF receive signal 126' includes frequencies within the receive passband 112 (in-band signal). Portions of the RF receive signal 126 with frequencies outside the receive passband 112 are out-of-band signals filtered out by the receive passband 112. The band pass filter circuit 110 also includes a transmit passband 113 for filtering RF transmit signal 136 to be transmitted by the antenna 105 as filtered RF transmit signal 136'. The simplified receiver chain 120 includes LNA 121 and receiver 125, which respectively amplify and receive (e.g., demodulate and detect) the RF receive signal 126 after band pass filtering. The simplified transmitter chain 130 includes transmitter 135 and power amplifier(s) 131, which respectively transmit (e.g., modulate) and amplify the RF transmit signal 136, respectively, prior to band pass filtering.

FIG. 1 also shows unwanted signals that enter to the LNA 121, in addition to the (in-band) filtered RF receive signal 126', i.e., the wanted signal. That is, the LNA 121 may also receive portions of out-of-band signals, indicated by representative out-of-band signal 127, as well as leaked transmit signals leaked from the transmit passband 113 of the filter circuit 110, indicated by representative leaked transmit signal 137. The out-of-band signal 127 and the leaked transmit signal 137 are interfering signals, as mentioned above. The interfering signals tend to intermodulate and generate harmonics, some of which may appear in-band of the filtered RF receive signal 126', interfering with and otherwise degrading the quality of the filtered RF receive signal 126'. For example, in the case of a narrow-band LNA 121, levels of the RF transmit signal 136 leak into LNA 121 as the leaked transmit signal 137. Although the leaked transmit signal 137 may be at low power levels because of the high isolation of the band pass filter circuit 110 between transmitter 135 and the receiver 125, the resulting interference can not be ignored, since the interference may appear in-band of the filtered RF receive signal 126 (in-band signal). The LNA 121 generates large enough intermodulation (IM) tones from the interference to affect the quality of the filtered RF receive signal 126. Because intrinsic second-order nonlinearity of the certain transistors contribute to third-order intermodulation (IM3), reducing or removing the intrinsic second-order nonlinearity contribution to the IM3, referred to as degeneration at the second harmonic frequency, substantially reduces the affects of the interfering signals within the LNA 121.

Figure 2A:
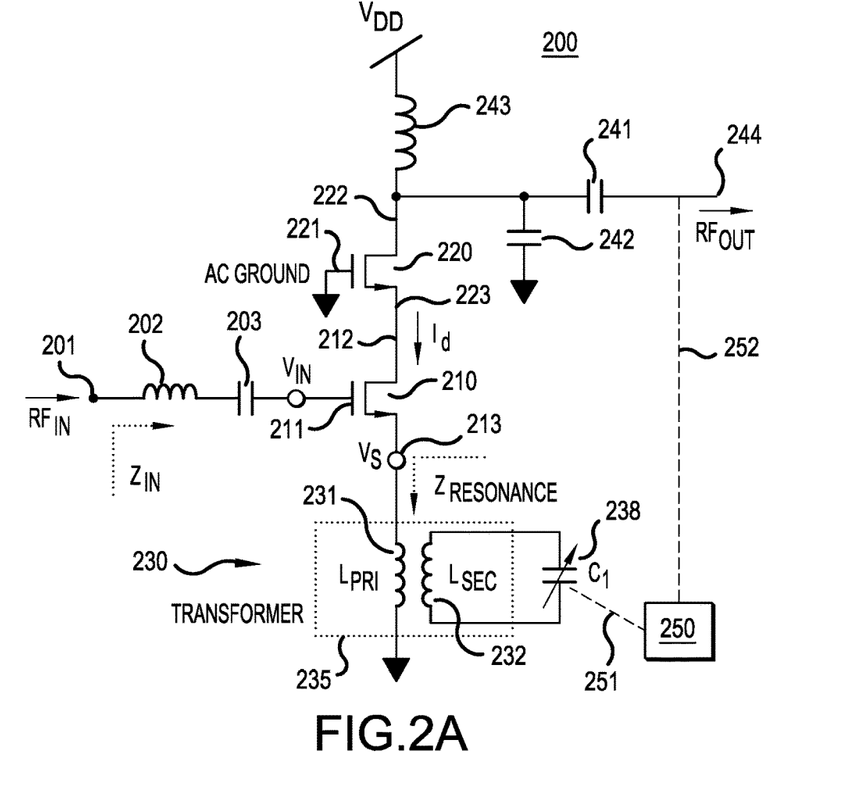
FIG. 2A is a simplified circuit diagram of an amplifier with a harmonic trap, according to a representative embodiment.
Figure 2B:
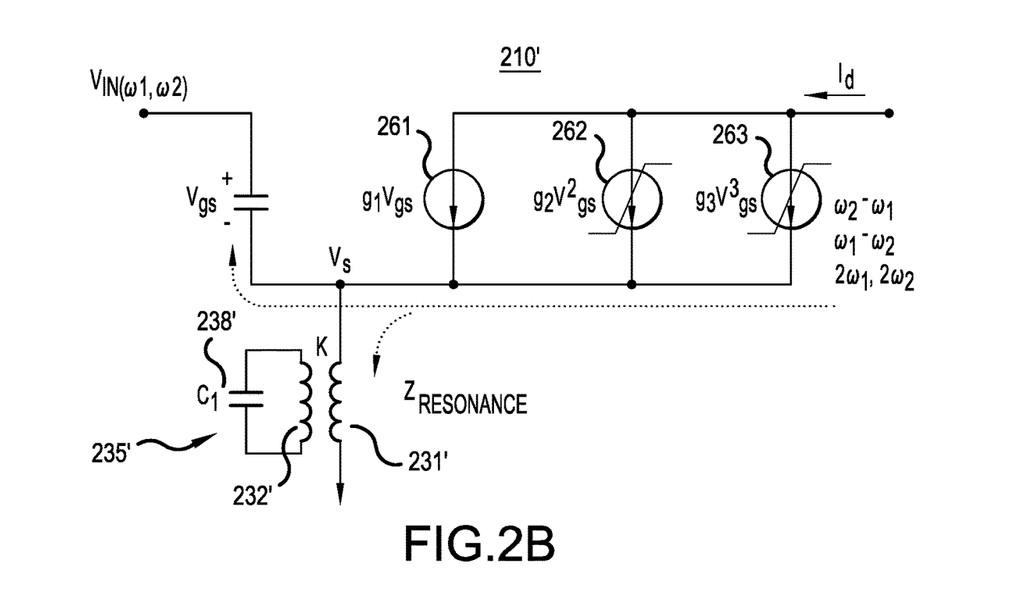
FIG. 2B is a small-signal equivalent circuit model of a transistor in the amplifier shown in FIG. 2A, according to a representative embodiment.

FIG. 2A is a simplified circuit diagram of a low noise amplifier (LNA) with a harmonic trap, according to a representative embodiment, and FIG. 2B is a small-signal equivalent circuit model of the LNA shown in FIG. 2A, according to a representative embodiment. Although LNAs are discussed below, for purposes of illustration, it is understood that the second-harmonic traps may be implemented in various other types of amplifiers without departing from the scope of the present teachings.

Referring to FIG. 2A, LNA 200 is a cascoded amplifier, including a first transistor 210 connected to an input port 201 for receiving input signal $RF_{IN}$ (e.g., filtered RF receive signal 126), and a second transistor 220 connected between the first transistor 210 and an output port 244 for outputting amplified RF output signal $RF_{OUT}$. The LNA 200 further includes a second-harmonic trap 230, discussed below, connected between the first transistor 210 and ground. Generally, the purpose of the LNA 200 is to amplify the received RF input signal $RF_{IN}$ to an acceptable level with minimal self-generated noise, and to output the amplified RF output signal $RF_{OUT}$.

Although the representative LNA 200 is shown with two transistors, it is understood that, in alternative embodiments, the LNA may include a single transistor (first transistor 210) or more than two transistors (transistor(s) in addition to the second transistor 220) without departing from the scope of the present teachings. Also, for purposes of illustration, both the first transistor 210 and the second transistor 220 are FETs, such as a metal-oxide-semiconductor field-effect transistor (MOSFET) or a complementary MOSFET (CMOS FET). However, it is understood that the first transistor 210 and the second transistor 220 may be implemented as other types of transistors, such as BJTs or heterojunction bipolar transistors (HBTs), or other types of FET transistors, such as silicon carbide (SiC) FETs, gallium arsenide (GaAs) FETs, gallium nitride (GaN) FETs, or indium gallium arsenide (InGaAs) FETs, without departing from the scope of the present teachings. Of course, use of BJTs, for example, would incorporate bases instead of gates, emitters instead of sources, and collectors instead of drains, along with corresponding circuit modifications, as would be apparent to one of ordinary skill in the art.

In the depicted embodiment, the first transistor 210 includes a first gate 211, a first drain 212, and a first source 213, and the second transistor 220 includes a second gate 221, a second drain 222 and a second source 223. The first gate 211 is connected to the input port 201 via an input inductor 202 and an input capacitor 203 connected in series. The input inductor 202 and input capacitor 203 collectively provide input impedance $Z_{IN}$, which may be a matching impedance. The first gate 211 receives the input voltage $V_{IN}$ (gate voltage). The first drain 212 is connected to the second source 223 of the second transistor 220, and the first source 213 is connected to ground via the second-harmonic trap 230. The second gate 221 may be connected to AC ground, and the second drain 222 may be connected to the output port 244 via series output capacitor 241 and shunt output capacitor 242 for outputting the amplified RF output signal $RF_{OUT}$. The second drain 222 is also connected to the voltage source $V_{DD}$ via inductor 243 to provide power to the LNA 200.

As mentioned above, the first and second transistors 210 and 220 may be implemented using other types of transistors. So, for example, if the first and second transistors were implemented using BJTs, then generally the first transistor would include a first base, a first collector and a first emitter, and the second transistor would include a second base, a second collector and a second emitter. The first base would be connected to the input port 201 via a matching circuit to receive the input voltage $V_{IN}$ (base voltage). The first collector would be connected to the second emitter the second transistor, and the first emitter would be connected to ground via the second-harmonic trap 230. The second base would be connected to ground, and the second collector would be connected to the output port 244 via series and shunt output capacitors 241 and 242 for outputting the amplified RF signal, as well as to the voltage source $V_{DD}$ via inductor 243. Component values and arrangements values and arrangements may vary to accommodate different types of transistors, meeting application specific design requirements of various implementations, as would be apparent to one of ordinary skill in the art.

Referring again to FIG. 2A, the second-harmonic trap 230 is connected between the first transistor 210 and ground. More particularly, the second-harmonic trap 230 is connected to the first source 213 to receive source voltage $V_S$ from the first transistor 210 responsive to the input voltage $V_{IN}$. In the depicted embodiment, the second-harmonic trap 230 includes a transformer 235 including a primary winding 231 (primary inductor) having a primary inductance $L_{PRI}$ and a secondary winding 232 (secondary inductor) having a secondary inductance $L_{SEC}$. The secondary winding is separated from the primary winding 231 by an insulation barrier in between. The primary winding 231 is a degeneration inductor connected between the first source 213 and ground, and as the primary winding, receives the input (source voltage $V_S$) of the transformer 235 from the first transistor 210. Generally, a degeneration inductor generates the real part at the input impedance $Z_{IN}$ of LNA 200. This helps to match the real part of the LNA 200 to the real part of the input impedance $Z_{IN}$. The second-harmonic trap 230 further includes a variable capacitor 238 connected in parallel with the secondary winding 232 of the transformer 235, the variable capacitor 238 having an adjustable capacitance ($C_1$).

The capacitance $C_1$ the variable capacitor 238 is adjusted such that the second-harmonic trap 230 has an impedance ($Z_{resonance}$) high enough to enable the second-harmonic trap 230 to become an electrically open circuit at a second harmonic frequency of the source voltage $V_S$ provided by the first transistor 210. In other words, the variable capacitor 238 is adjusted until the impedance $Z_{resonance}$ is substantially infinite, meaning that the impedance $Z_{resonance}$ is large enough that no current or a very small amount of current (i.e., small enough to have no practical effect on the operation of the LNA 200) passes through the second-harmonic trap 230, or more particularly passes through the primary winding $L_{PRI}$ to ground. As a result, the first transistor 210 generates substantially no current at the second harmonic frequency.

Notably, the parallel connection between variable capacitor 238 and the secondary winding 232 creates an LC resonance circuit ("L" for inductor and "C" for capacitor). The LC resonance circuit has a corresponding LC resonant frequency, which depends on the respective values of the variable capacitor 238 and the secondary winding (inductor) 232. Because the capacitance $C_1$ of the variable capacitor 238 is adjustable, the LC resonant frequency of the LC resonance circuit is likewise adjustable, which essentially enables tuning of the LC resonant frequency to a desired value. For example, the LC resonant frequency affects the value of the impedance $Z_{resonance}$, and thus can be used to set the value of the impedance $Z_{resonance}$ substantially to infinity, as discussed below In general, the impedance $Z_{resonance}$ at the second harmonic frequency of the source voltage $V_S$ is responsive to the secondary inductance $L_{SEC}$ of the secondary winding, a coupling coefficient K of the transformer 235 and the adjustable capacitance $C_1$ of the variable capacitor 238, as discussed below with reference to Equation (1). Thus, the capacitance $C_1$ of the variable capacitor 238 is adjusted such that LC resonant frequency of (i) the secondary inductance $L_{SEC}$ of the a secondary winding 232 and (ii) the adjustable capacitance $C_1$ of the variable capacitor 238 substantially equals a reciprocal of the second harmonic frequency of the second harmonic of the source voltage $V_S$, resulting in the high second-harmonic trap impedance $Z_{resonance}$.

FIG. 2B shows a small-signal equivalent model 210' of the first transistor 210 in the LNA 200 in FIG. 2A. The small-signal equivalent model 210' assumes application of a small signal as the input voltage $V_{IN}$ (as well as the received RF signal at the input port $RF_{INT}$), where a small signal has corresponding amplitude small enough to result in a linear response of the electronic circuit to which it is applied. In other words, a small signal operates over a limited range of amplitude, resulting in a linear circuit response. In comparison, a large signal operates over a larger range of the amplitude, tending to result in a non-linear circuit response. As applied to the embodiment shown in FIG. 2B, when the input voltage $V_{IN}$ is a small signal, the response of the first transistor 210 in the form of the source voltage $V_S$ is linear.

Referring to FIG. 2B, it is assumed for purposes of illustration that input voltage $V_{IN}$ has two frequency components, $\omega_1$ and $\omega_2$. Thus the source voltage $V_S$ contains frequency components $2\omega_1$, $2\omega_2$, and $\omega_1 \pm \omega_2$ due to the second-order distortion. These frequency components result in third-order intermodulation (IM3) tones of $2\omega_1 \pm \omega_2$ and $2\omega_2 \pm \omega_1$. In order words, the intrinsic second-order nonlinearity of the first transistor 210 contributes to IM3. The second-harmonic trap 230 reduces the intrinsic second-order nonlinearity contribution to the IM3, referred to as degeneration at the second harmonic frequency.

In the small-signal equivalent model 210' of the first transistor 210 of the LNA 200, Vgs indicates the voltage across the gate and the source of the first transistor 210 (gate-source voltage). The drain current $I_d$ of the first transistor 210 is applied to model first current source 261, model second current source 262 and model third current source 263. The model first current source 261 indicates a DC current source, the model second current source 262 indicates the second-order current model with the derivative of the drain current $I_d$ according to Vgs, and the model third current source 263 indicates the third-order current model with the derivative of the drain current $I_d$ according to Vgs.

The small-signal equivalent model 210' also includes model transformer 235' including primary winding 231' (which is a first or primary inductor) having a primary inductance $L_{PRI}$ and secondary winding 232' (which is a second or secondary inductor) having a secondary inductance $L_{SEC}$. A model variable capacitor 238' is connected in parallel with the secondary winding 232', the variable capacitor 238' having an adjustable capacitance $C_1$. The model transformer 235' also shows coupling coefficient K between the primary winding 231' and the secondary winding 232'. The primary winding 231' is connected between the source of the first transistor 210, for receiving the source voltage $V_S$, and ground. Since the variable capacitor 238' is connected in parallel with the secondary winding 232' across the insulation barrier, changing the adjustable capacitance $C_1$ of the variable capacitor 238' has no direct effect on the primary winding 231'.

In a conventional LNA, the source voltage $V_S$ impedance would be determined simply by the inductance of the degeneration inductor connected between the transistor source (providing the source voltage $V_S$) and ground. Thus, the conventional source voltage impedance is generally relatively low, and thus unable to substantially stop current flow through the transistor of the conventional LNA (i.e., unable to effectively provide an open circuit), in which the transistor outputs a signal with second harmonic components of the source voltage $V_S$.

In comparison, the addition of the second-harmonic trap 230 with the transformer 235 enables a much higher impedance to be reached at the second harmonic frequency, effectively stopping current flow of the LNA 200 using at least the coupling coefficient K and the adjustable capacitance $C_1$, as indicated in the small-signal equivalent model 210'. In particular, referring to FIG. 2B, the impedance $Z_{resonance}$ across the model transformer 235' is determined by Equation (1):

$$Z_{resonance} = j\left(\frac{-\omega^3 C_1 L_{SEC} L_{PRI} + \omega L_{PRI} + \omega^3 K^2 C_1 L_{SEC} L_{PRI}}{1 - \omega^2 C_1 L_{SEC}}\right) \quad \text{Equation (1)}$$

Referring to Equation (1), $\omega$ is the frequency of the source voltage $V_S$, $\omega^2$ is the second harmonic frequency of the source voltage $V_S$, and $\omega^3$ is the third harmonic frequency of the source voltage $V_S$. Also, as discussed above, $L_{PRI}$ is the primary inductance of the primary winding 231', $L_{SEC}$ is the secondary inductance of the secondary winding 232', $C_1$ is the adjustable capacitance of the variable capacitor 238', and K is the coupling coefficient of the model transformer 235'.

The denominator of Equation (1) includes the product of the second harmonic frequency $\omega^2$, the capacitance value $C_1$ and the secondary inductance value $L_{SEC}$. This product is subtracted from unity (one). As discussed above, the combination of the capacitance value $C_1$ and the secondary inductance value $L_{SEC}$ creates an LC resonance circuit having an LC resonant frequency. Because the capacitance value $C_1$ is adjustable, it may be adjusted until the LC resonant frequency substantially equals a reciprocal of the second harmonic frequency $\omega^2$, in which case the product of the secondary inductance value $L_{SEC}$, the adjustable capacitance value $C_1$ and the second harmonic frequency $\omega^2$ equals one.

Because one minus one equals zero, the denominator of Equation (1) become zero, and thus the modeled value of the impedance $Z_{resonance}$ becomes infinity. The impedance $Z_{resonance}$ having a value of infinity creates an open circuit between the source voltage $V_S$ and ground, which stops the current flow $I_d$ through the small-signal equivalent model 210'. When applied to the actual LNA 200, the impedance $Z_{resonance}$ becomes very high, approaching infinity, at the second harmonic frequency of the source voltage $V_S$ provided by the first transistor 210, thereby causing a substantially open circuit. This stops the current flow $I_d$ through the first transistor 210 (and the LNA 200) at the second harmonic frequency, providing a second-harmonic trap (second-harmonic trap 230).

Accordingly, as can be seen from Equation (1), the impedance $Z_{resonance}$ between the first source 213 and ground at the second harmonic frequency of the source voltage $V_S$ is very high (substantially infinity), as a practical matter, meaning that the degeneration factor for second harmonic frequency is very high as well. That is, the impedance $Z_{resonance}$ is high enough to assure that there will not be any second harmonic component generated from the LNA 200 using the harmonic trap method, according to various embodiments.

In an embodiment the capacitance $C_1$ of the variable capacitor 238 may be adjusted by a controller, computer or processor, illustratively indicated by controller 250. For example, the controller 250 may be programmed and/or configured to apply a control signal to the variable capacitor 238, indicated by dashed line 251, for adjusting the capacitance of the variable capacitor 238. The controller 250 may adjust the capacitance in response to feedback based on one or more of a variety of parameters received from the LNA 200, indicated by dashed line 252.

For example, the controller 250 may monitor the gain at the output port 244 of the LNA 200 at the second harmonic frequency as feedback indicated by dashed line 252, which reflects the impedance $Z_{resonance}$ across the second-harmonic trap 230 and/or across the primary winding 231 of the transformer 235. The gain may be monitored, for example, by determining the difference in magnitude (amplitude) between the RF input signal $RF_{IN}$ and the RF output signal $RF_{OUT}$ using an oscilloscope or signal analyzer. The lower the gain (e.g., the less change in magnitude of the RF input signal $RF_{IN}$), the higher the impedance Zresonance, and thus the closer the resonant frequency LC is to the second harmonic frequency of the source voltage $V_S$. That is, the impedance Zresonance is approaching an acceptably high value, which may be substantially infinity, for example (lesser high impedances may be effective, as a practical matter), as the gain approaches zero. The capacitance of the variable capacitor 238 may be adjusted via the dashed line 251 to increase the impedance Zresonance when the gain at the output port 244 is still high enough to indicate that the resonant frequency LC does not match the second harmonic frequency. For example, the adjustable capacitance of the variable capacitor 238 may be increased, which in turn decreases the LC resonant frequency of the combined secondary winding 232 and the variable capacitor 238 (since capacitance is inversely proportional to LC resonant frequency). The controlled increase in the adjustable capacitance may continue until the gain becomes substantially zero, indicating the impedance $Z_{resonance}$ has become substantially infinite (great enough to substantially stop current flow), which means that the LC resonant frequency is substantially equal to the reciprocal of the second harmonic frequency, as discussed above. The gain may be considered substantially zero when the LNA 200 has no practical effect on the magnitude of the RF input signal $RF_S$. For example, the gain may be considered substantially zero when the input signal $RF_{IN}$ passes directly to the output port 244 without loss.

Of course, other feedback parameters may be monitored to determine when the LC resonant frequency has reached the desired value, and to indicate to the controller 250 what adjustments to make to the variable capacitor 238, without departing from the scope of the present teachings. For example, the source current $I_S$ from the first source 213 through the primary winding 231 of the transformer 235 may be monitored by the controller 250 (e.g., using an ammeter), as feedback to compare to a predetermined current threshold, which would be substantially equal to zero. The controller 250 makes adjustments to the capacitance of the variable capacitor 238 as needed to reduce the source current $I_S$ to reach the current threshold. When source current $I_S$ becomes equal to (or less than) the current threshold, this indicates that the impedance $Z_{resonance}$ is high enough to substantially stop current flow (i.e., effectively providing an open circuit), and thus also indicates that the LC resonant frequency is substantially equal to the reciprocal of the second harmonic frequency. Notably, in this example, the current threshold does not necessarily need to be zero, since a very small amount of current may pass through the primary winding 231 while the second-harmonic trap 230 still sufficiently blocks the second harmonic.

In another example, the actual LC resonance of the adjustable capacitance and the secondary inductance may be monitored by the controller 250 (e.g., using a spectrum analyzer or oscilloscope), as feedback indicated by the dashed line 252, and compared to the second harmonic frequency of the second harmonic of the source voltage. The second harmonic frequency may be known beforehand or it likewise may be monitored to enable the comparison. When the LC resonant frequency does not match the reciprocal of the second harmonic frequency, the controller 250 makes adjustments to the capacitance of the variable capacitor 238 as needed to change the LC resonant frequency in the direction and amount necessary to substantially equal to the reciprocal of the second harmonic frequency.

Alternatively, the capacitance $C_1$ of the variable capacitor 238 may be manually adjusted to achieve the desired affect, without departing from the scope of the present teachings. For example, manual adjustments may be made empirically, through trial and error, while a user monitors one or more parameters of the LNA 200, discussed above. Also, in an embodiment, the frequency of the voltage source and/or the corresponding second harmonic frequency may be known beforehand, as well as the value of the secondary inductance. In this case, the capacitance of the variable capacitor 238 simply may be calculated and implemented in the variable capacitor 238.

In various embodiments, the controller 250 may be integrated with the LNA 200, or may be in a separate processor, computer, or other control unit. For example, the controller 250 may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system.

A memory (not shown) accessible by the controller 250 may be implemented by any number, type and combination of random access memory (RAM) and read-only memory (ROM), for example, and may store various types of information, such as computer programs and software algorithms executable by the controller 250 (and/or other components), as well as data and/or signals storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

Figure 3:
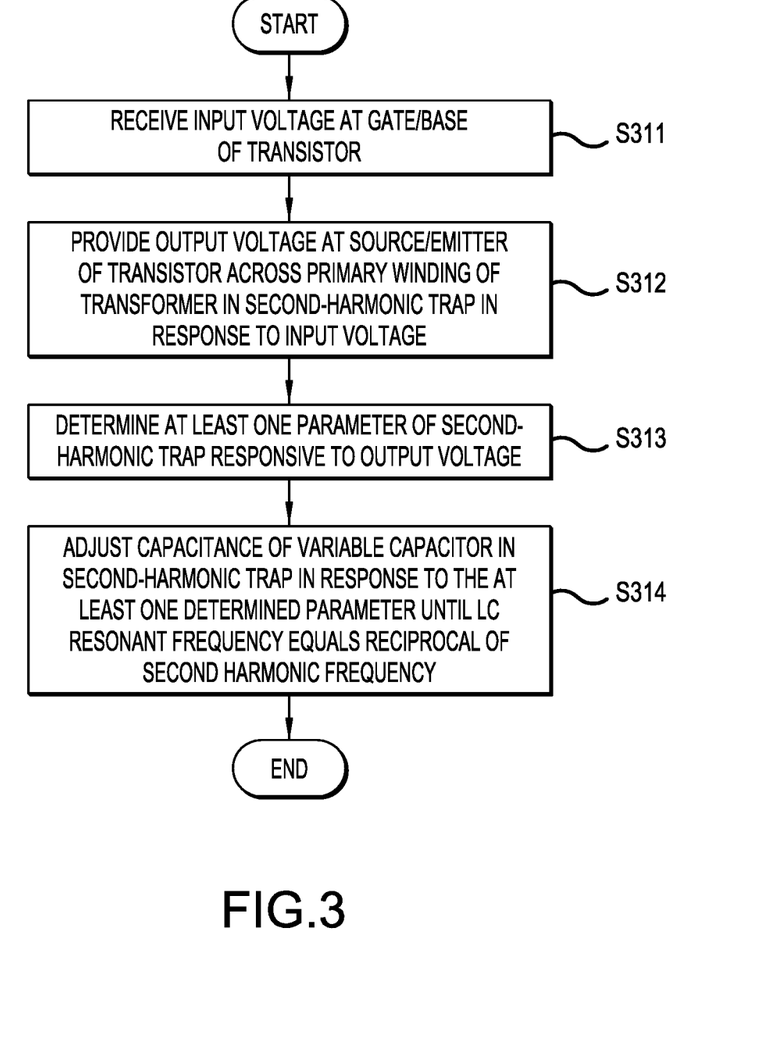
FIG. 3 is a flow diagram of a method of reducing second-order nonlinearity of a transistor in an amplifier using a second-harmonic trap, according to a representative embodiment.

FIG. 3 is a flow diagram of a method of reducing second-order nonlinearity of a transistor in a LNA using a second-harmonic trap, according to a representative embodiment. In the example, the LNA includes cascoded first and second transistors, and the method is directed to reducing the second-order nonlinearity of the LNA. The first transistor receives an input voltage through an RF input port and series connected input capacitor(s) and inductor(s)). The first transistor includes a source (assuming for purposes of explanation, and not limitation, that the first and second transistors are FETs, otherwise the first transistor includes an emitter) connected to ground via the second-harmonic trap. The second transistor has an AC grounded gate (or base), a source connected to a drain (or collector) of the first transistor and a drain connected to an RF output port via series and shunt connected output capacitors.

A second-harmonic trap is connected between the first transistor and ground, where the second-harmonic trap comprises a transformer with a primary winding (primary inductor), connected between the source of the first transistor (e.g., to receive a source voltage $V_S$) and ground, and a secondary winding (secondary inductor) separated from the primary inductor by an insulation barrier. The second-harmonic trap further includes a variable capacitor connected in parallel with the secondary winding of the transformer, as discussed above with reference to FIGS. 2A and 2B, for example.

Referring to FIG. 3, the method of reducing second-order nonlinearity includes receiving an input voltage signal at a gate of the first transistor of the LNA in block S311. The input voltage may be an RF input signal that has passed through a matching circuit. In block S312, an output voltage (e.g. source voltage) is provided at a source of the first transistor in response to the received input voltage. The output voltage is applied to the primary winding of the transformer which is connected to the first transistor source.

At least one parameter, which is responsive to the output voltage, of the second-harmonic trap is determined in block S313. As discussed below, the at least one parameter may be impedance, current, or LC resonant frequency, for example, although other parameters may be incorporated without departing from the scope of the present teachings. In block S314, an adjustable capacitance of the variable capacitor is adjusted in response to the at least one determined parameter until an LC resonant frequency of the adjustable capacitance and a secondary inductance of the secondary winding equals a reciprocal of a second harmonic frequency of the source voltage, effectively creating an electrically open circuit between the source of the first transistor and ground. Thus, no current (or very little current) flows in the first transistor at the second harmonic frequency of the source voltage signal. Accordingly, no current (or very little current) flows in the LNA as well, such that the LNA produces no RF output signal at the second harmonic frequency of the first transistor.

In an embodiment, adjusting the adjustable capacitance of the variable capacitor, until the LC resonant frequency of the adjustable capacitance and the secondary inductance of the secondary winding equals a reciprocal of a second harmonic frequency, may include monitoring the gain at the output port of the LNA at the second harmonic frequency, which reflects the impedance Zresonance across the second-harmonic trap and/or across the primary winding of the transformer; and adjusting the adjustable capacitance of the variable capacitor (e.g., using controller 150 or manually) until the monitored gain is substantially zero. Generally, the lower the gain, the higher the impedance Zresonance, and thus the closer the resonant frequency LC is to the second harmonic frequency of the source voltage $V_S$. As discussed above, the high impedance may approximately infinity, in that the impedance is high enough that the second-harmonic trap is effectively an open circuit.

In another embodiment, adjusting the adjustable capacitance of the variable capacitor, until the LC resonant frequency of the adjustable capacitance and the secondary inductance of the secondary winding equals a reciprocal of a second harmonic frequency, may include determining source current through the primary winding of the transformer in the second-harmonic trap; and adjusting the adjustable capacitance of the variable capacitor (e.g., using controller 150 or manually) until the source current is substantially zero. As discussed above, when source current is substantially zero, this indicates that the impedance across the second-harmonic trap and/or the primary winding of the transformer in the second-harmonic trap is high enough to substantially stop current flow, again, effectively providing an open circuit.

In another embodiment, adjusting the adjustable capacitance of the variable capacitor, until the LC resonant frequency of the adjustable capacitance and the secondary inductance of the secondary winding equals a reciprocal of a second harmonic frequency, may include determining the LC resonant frequency of the adjustable capacitance and the secondary inductance; determining the second harmonic frequency of the source voltage signal; comparing the determined LC resonant frequency to the second harmonic frequency of the source voltage signal; and adjusting the adjustable capacitance of the variable capacitor (e.g., using controller 150 or manually) until the determined LC resonant frequency of the adjustable capacitance and the secondary inductance matches the reciprocal of the determined second harmonic frequency of the second harmonic of the source voltage. Of course, other techniques of determining when the LC resonant frequency of the adjustable capacitance and the secondary inductance matches the reciprocal of the determined second harmonic frequency of the second harmonic of the source voltage, and/or when the second harmonic frequency trap is a substantially open circuit, may be incorporated without departing from the scope of the present teachings.

Although FIGS. 2A, 2B and 3 have been described with reference to first and second transistors, it is understood that additional transistors, e.g., directly or indirectly connecting to the drain of the first transistor, may be included without departing from the scope of the present teachings. Also, as should be appreciated, the selections of the types of transistors and corresponding materials dictate the processing techniques selected for fabricating the LNA, according to various embodiments. Such techniques and materials are within the purview of one of ordinary skill in the art of semiconductor processing and are generally not detailed herein to avoid obscuring the description of the representative embodiments. Illustratively, other types of transistors may include pseudomorphic high electron mobility transistors (pHEMTs), or enhanced pseudomorphic high electron mobility transistor (E-pHEMTs).

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. An amplifier circuit for amplifying an input signal, the amplifier circuit comprising:
a transistor configured to receive an input voltage via an input port; and
a second-harmonic trap connected between the transistor and ground, the second-harmonic trap having a high impedance high enough to enable the second-harmonic trap to act as an open circuit at a second harmonic frequency of a voltage provided by the transistor, the second-harmonic trap comprising:
a transformer including a primary winding having a primary inductance and a secondary winding having a secondary inductance, the primary winding receiving the voltage provided by the transistor; and
a variable capacitor connected in parallel with the secondary winding of the transformer, the variable capacitor having an adjustable capacitance,
wherein the variable capacitor and the secondary winding form an LC resonance circuit, and the variable capacitor is adjustable such that LC resonant frequency of the LC resonance circuit substantially equals a reciprocal of the second harmonic frequency, resulting in the high second-harmonic trap impedance.

2. The amplifier circuit of claim 1, wherein the primary winding is a degenerative inductor connected between the transistor and ground.

3. The amplifier circuit of claim 1, wherein the amplifier circuit comprises a low noise amplifier (LNA).

4. The amplifier circuit of claim 1, wherein the transistor is a first field effect transistor (FET) having a gate connected to the input port via an input inductor and an input capacitor for receiving the input voltage, and a source connected to the primary winding of the transformer, and
wherein the voltage provided by the transistor and received by the primary winding is a source voltage output by the source of the first FET.

5. The amplifier circuit of claim 4, further comprising:
a second FET having a source connected to a drain of the first FET, and a drain connected to an output port of the amplifier circuit via at least one output capacitor for outputting the amplified input signal.

6. The amplifier circuit of claim 5, wherein the drain of the second FET is further connected to a power source.

7. The amplifier circuit of claim 1, further comprising:
a controller programmed to adjust the adjustable capacitance of the variable capacitor until the LC resonant frequency of the LC resonance circuit substantially equals the reciprocal of the second harmonic frequency.

8. A low noise amplifier (LNA) circuit comprising:
an input port for receiving a radio frequency (RF) input signal;
a first transistor comprising a first gate for receiving an input voltage corresponding to the RF input signal;
a transformer comprising a primary winding having a primary inductance and a secondary winding having a secondary inductance, the primary winding being connected between a first source of the first transistor and ground, the primary winding receiving a source voltage from the first source; and a variable capacitor connected in parallel with the secondary winding of the transformer, the variable capacitor having an adjustable capacitance, wherein resonance impedance between the first source and ground is increased to a high impedance at a second harmonic frequency of the source voltage in response to the secondary inductance of the secondary winding, a coupling coefficient of the transformer and adjustment of the adjustable capacitance, the adjustable capacitance being adjusted until an LC resonant frequency of the secondary inductance and the adjustable capacitance equals a reciprocal of the second harmonic frequency of the source voltage, and wherein the high impedance provides an electrically open circuit between the first source and ground, such that the first transistor generates substantially no current at the second harmonic frequency.

9. The LNA circuit of claim 8, further comprising a first inductor and a first capacitor connected in series between the input port and the first gate.

10. The LNA circuit of claim 8, further comprising:
an output port for outputting an amplified RF output signal corresponding to the RF input signal; and
a second transistor cascoded with the first transistor, wherein the second transistor comprises a second source connected to a first drain of the first transistor, and a second drain connected to the output port and to a voltage source.

11. The LNA circuit of claim 10, further comprising:
a second series capacitor connected in series between the second drain and the output port;
a second shunt capacitor connected between the output port and ground; and
a second inductor connected in series between the second drain and the voltage source.

12. The LNA circuit of claim 8, further comprising:
a controller programmed to adjust the adjustable capacitance of the variable capacitor until the LC resonant frequency of the secondary inductance and the adjustable capacitance equals the reciprocal of the second harmonic frequency of the source voltage.

13. A method of reducing second-order nonlinearity of a transistor in a low noise amplifier, having a second-harmonic trap connected between the transistor and ground, the second-harmonic trap comprising a transformer with a primary winding connected between the transistor and ground and a secondary winding, and a variable capacitor connected in parallel with the secondary winding, the method comprising:
receiving an input voltage at a gate or a base of the transistor;
providing an output voltage at a source or a emitter of the transistor across the primary winding of the transformer in response to the received input voltage;
determining at least one parameter of the second-harmonic trap responsive to the output voltage; and
adjusting an adjustable capacitance of the variable capacitor in response to the determined at least one parameter until an LC resonant frequency of the adjustable capacitance and a secondary inductance of the secondary winding equals a reciprocal of a second harmonic frequency of the output voltage, creating an electrically open circuit between the transistor and ground, such that no current is generated by the transistor at the second harmonic frequency of the output voltage.

14. The method of claim 13, wherein adjusting the adjustable capacitance of the variable capacitor comprises:
monitoring gain at an output port of the low noise amplifier at the second harmonic frequency; and
adjusting the adjustable capacitance of the variable capacitor until the monitored gain at the output port is substantially zero, indicating that impedance across the primary winding of the transformer is high enough to create the electrically open circuit between the transistor and ground.

15. The method of claim 14, wherein the high impedance is approximately infinity.

16. The method of claim 13, wherein adjusting the adjustable capacitance of the variable capacitor comprises:
determining source current from the source of the transistor through the primary winding of the transformer in the second-harmonic trap as the determined at least one parameter; and
adjusting the adjustable capacitance of the variable capacitor until the determined source current is substantially zero.

17. The method of claim 13, wherein adjusting the adjustable capacitance of the variable capacitor comprises:
determining the LC resonant frequency of the adjustable capacitance and the secondary inductance as the determined at least one parameter;
determining the second harmonic frequency of the output voltage;
comparing the determined LC resonant frequency to the second harmonic frequency of the output voltage; and
adjusting the adjustable capacitance of the variable capacitor until the determined LC resonant frequency of the adjustable capacitance and the secondary inductance matches the reciprocal of the determined second harmonic frequency of the second harmonic of the output voltage.

18. The method of claim 13, wherein adjusting the adjustable capacitance is performed using a controller in response to feedback regarding the determined at least one parameter.

19. The amplifier circuit of claim 7, where the controller is further programmed to adjust the adjustable capacitance of the variable capacitor in response to feedback based on at least one of gain of the amplifier circuit, current through the amplifier circuit and LC resonance of the LC resonance circuit.

* * * * *